United States Patent
Saether

(10) Patent No.: US 7,693,669 B2
(45) Date of Patent: Apr. 6, 2010

(54) METHOD AND CIRCUIT FOR DETECTING A BROWN OUT CONDITION

(75) Inventor: Terje Saether, Trondheim (NO)

(73) Assignee: Atmel Corporation, San Jose, CA (US)

( * ) Notice: Subject to any disclaimer, the term of this patent is extended or adjusted under 35 U.S.C. 154(b) by 343 days.

(21) Appl. No.: 11/104,960

(22) Filed: Apr. 12, 2005

(65) Prior Publication Data

US 2006/0229830 A1    Oct. 12, 2006

(51) Int. Cl.
G06F 11/30    (2006.01)
G01R 31/00    (2006.01)

(52) U.S. Cl. .................... 702/59; 702/58; 702/64; 324/522

(58) Field of Classification Search ............. 702/57–59, 702/60, 63–65, 117, 124, 189
See application file for complete search history.

(56) References Cited

U.S. PATENT DOCUMENTS

| | | | | |
|---|---|---|---|---|
| 4,855,722 | A * | 8/1989 | Mostyn et al. ............... | 340/660 |
| 5,371,709 | A | 12/1994 | Fisher et al. | |
| 5,396,115 | A * | 3/1995 | Coffman et al. ............. | 327/143 |
| 5,495,453 | A | 2/1996 | Wojciechowski et al. | |
| 5,564,010 | A * | 10/1996 | Henry et al. ................. | 714/22 |
| 5,606,511 | A * | 2/1997 | Yach ........................... | 702/64 |
| 5,943,635 | A | 8/1999 | Inn .............................. | 702/60 |
| 6,246,626 | B1 * | 6/2001 | Roohparvar ................ | 365/226 |
| 6,246,656 | B1 | 6/2001 | Kawakubo et al. ........ | 369/112.23 |
| 6,366,521 | B1 | 4/2002 | Roohparvar ................ | 365/226 |
| 6,618,312 | B2 * | 9/2003 | Cheung et al. ............. | 365/226 |
| 6,661,724 | B1 * | 12/2003 | Snyder et al. .............. | 365/211 |
| 6,711,701 | B1 | 3/2004 | Roohparvar et al. ....... | 714/29 |
| 6,854,067 | B1 * | 2/2005 | Kutz et al. .................. | 713/340 |
| 2002/0163368 | A1 | 11/2002 | Cheung et al. | |
| 2003/0122590 | A1 | 7/2003 | O | |
| 2003/0223294 | A1 | 12/2003 | Roohparvar ................ | 365/201 |
| 2004/0004896 | A1 | 1/2004 | Zitlaw et al. ............... | 365/227 |
| 2005/0138454 | A1 * | 6/2005 | Darmawaskita et al. ..... | 713/323 |

FOREIGN PATENT DOCUMENTS

| | | |
|---|---|---|
| TW | 528872 | 4/2003 |
| WO | WO-2006110834 A1 | 10/2006 |

OTHER PUBLICATIONS

095112956, "Taiwanian Application Serial No. 095112956, Office mailed Oct. 9, 2008", 9, 5 pages.
"European Application No. 06749908.7, Supplemental European Search Report mailed Apr. 5, 2009", 8 pgs.

(Continued)

*Primary Examiner*—Hal D Wachsman
(74) *Attorney, Agent, or Firm*—Schwegman, Lundberg & Woessner, P.A.

(57) ABSTRACT

A brown out detection circuit includes a sense amplifier for sensing a current level exhibited by a flash cell. Combinatorial logic is coupled to the sense amplifier for identifying a program condition of the flash cell based on the sensed current level, including a brown out condition, in order to provide a warning to avoid potential malfunction from a brown out condition.

19 Claims, 2 Drawing Sheets

OTHER PUBLICATIONS

"International Application Serial No. PCT/US06/13689, International Search Report mailed Aug. 24, 2006", 2 pgs.

"International Application Serial No. PCT/US06/13689, Written Opinion mailed Aug. 24, 2006", 6 pgs.

"Taiwanian Application Serial No. 095112956, Response filed Jan. 10, 2009 to Office Action mailed Oct. 9, 2008", 5 pgs.

"Chinese Application Serial No. 200680011925.X, Office Action mailed Aug. 7, 2009", 9 pgs.

"Taiwanese Application Serial No. 095112956, Notice of Allowance mailed Sep. 14, 2009", 3 pgs.

"Taiwanese Application Serial No. 095112956, Response filed Jan. 12, 2009 to Office Action dated Dec. 9, 2008 (with translation)", 5 pgs.

* cited by examiner

METHOD AND CIRCUIT FOR DETECTING A BROWN OUT CONDITION

FIELD OF THE INVENTION

The present invention relates to brown out detection systems.

BACKGROUND OF THE INVENTION

Recent advances in technology have led to an increase in performance and a decrease in size of semiconductor microcontroller or microprocessor chips. Microcontrollers generally receive power from a supply voltage that is external to the microcontroller. In order to ensure proper operation, many conventional microcontrollers employ a brown out detection system.

Brown out detection systems typically detect when a supply voltage level drops below a minimum level that is necessary for proper operation of the microcontroller and/or the item using the microcontroller. Brown out detection systems help protect the microcontroller against total power failure and against "dips" in the received voltage signal.

The ability to help protect a microcontroller and maintain proper functioning is widely beneficial, but of particular importance in critical application environments, including medical environments. A need exists for a brown out detection system that is straightforward, efficient, and effective. The present invention addresses such a need.

BRIEF SUMMARY OF THE INVENTION

Aspects of brown out detection are described. Included in these aspects is a brown out detection circuit. The brown out detection circuit includes a sense amplifier for sensing a current level exhibited by a flash cell. Combinatorial logic is coupled to the sense amplifier for identifying a program condition of the flash cell based on the sensed current level, including a brown out condition, in order to provide a warning to avoid potential malfunction from a brown out condition.

Through the present invention, the program state of flash memory is employed in providing brown out detection. In a straightforward and efficient manner, the present invention provides detector circuitry that monitors for a drop in a current level of a programmed flash memory cell in order to identify a brown out condition. Potential malfunction can be avoided by use of the warning signal to allow for reprogramming or shut down of a controller. These and other advantages of the present invention will be more fully understood in conjunction with the following detailed description and accompanying drawings.

DETAILED DESCRIPTION OF THE INVENTION

The present invention is related to brown out detection systems. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

In accordance with the present invention, the program state of flash memory is employed in providing brown out detection. As is well understood in the art, flash memory is a type of EEPROM that can be erased and reprogrammed in blocks. Many modern PCs have their BIOS stored on a flash memory chip so that it can easily be updated if necessary. A typical flash memory comprises a memory array which includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Figure 1:
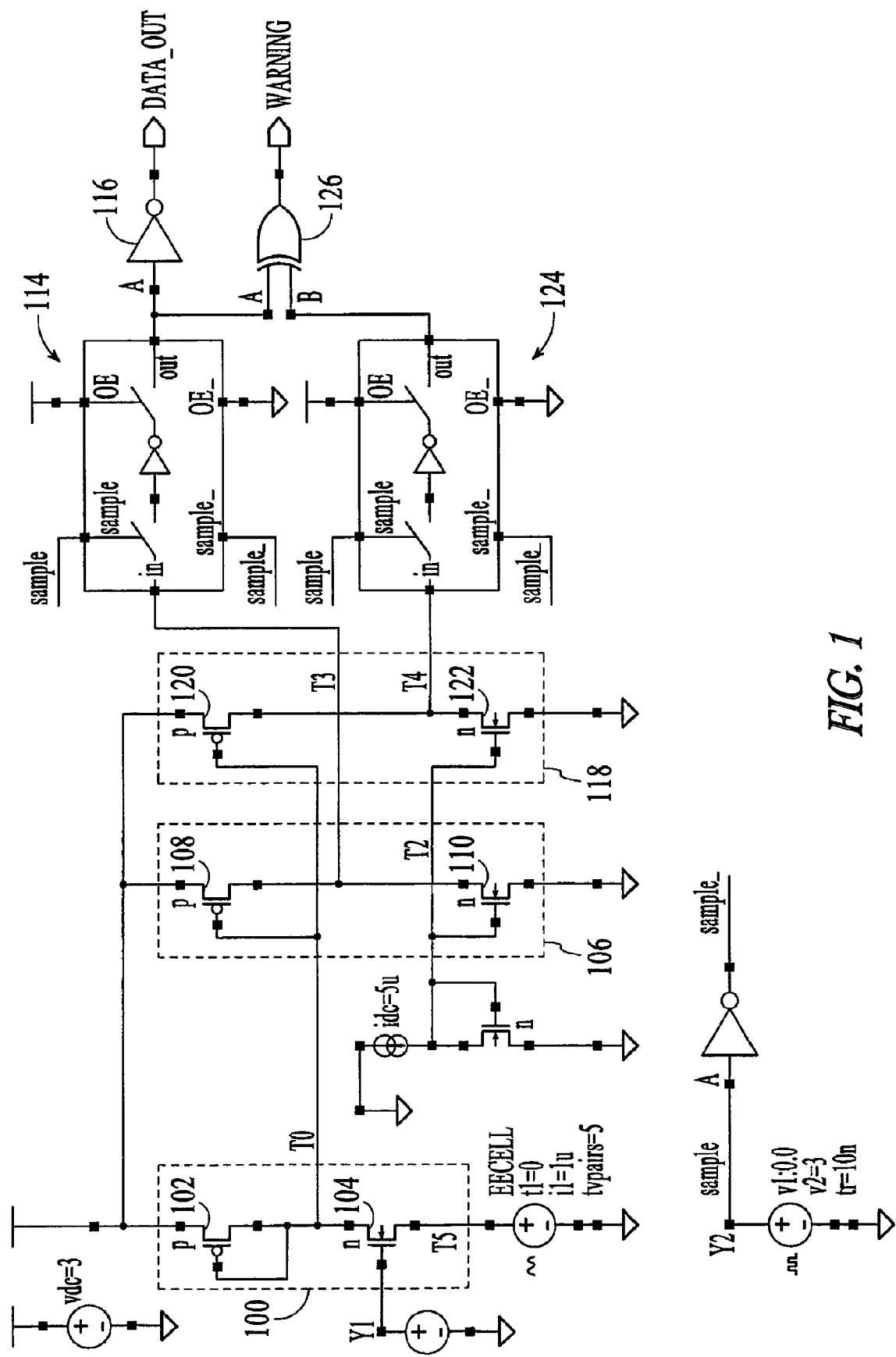
FIG. 1 illustrates a circuit diagram of an example embodiment of a brown out detector in accordance with the present invention.

In accordance with the present invention, the data in a flash cell is utilized in providing brown out detection. FIG. 1 illustrates a circuit diagram of a transimpedance sense amplifier to demonstrate providing brown out detection with a flash cell in accordance with the present invention. As shown, the circuit includes an amplifier 100 comprising transistors 102 and 104. Coupled to the amplifier 100 is a current comparator 106 comprising transistors 108 and 110. Also coupled to the amplifier is a flash cell represented by a current source 112. The data from the current comparator 106 is sampled and held by a latch 114. Inverter 116 buffers the output from the latch 114 to provide a DATA_OUT signal.

A second current comparator 118, comprising transistors 120 and 122, is coupled to the amplifier 100. A latch 124 is coupled to comparator 118. Combinatorial logic 126 in the form of an XOR gate is coupled to the latch 124 and outputs a signal (WARNING) as a brown out detection output.

In operation, when the current of current source 112 is low for an unprogrammed cell, the DATA_OUT will be low. When the current is high for a programmed cell, the DATA_OUT will be high. In detecting a brown out condition, the maintenance of the charge on a flash cell is monitored by monitoring the current seen. When a flash cell starts to lose its charge, the current will drop. If the current drops below a predetermined threshold (e.g., if the current drops below about 80% of a maximum value), the WARNING signal is output based on the combination through XOR gate 126 of the sampled states of current comparators 106 and 118 latched by latches 114 and 124.

In this manner, the brown out detector senses when the flash cells start to lose their contents. This may happen, for example, if the flash memory is subjected to high temperature over an extended period of time, subjected to radiation, etc. However, it will also detect when the cell current is too low, which will happen at low voltage supplies, or even when the clock frequency of the chip is too high (and the flash memory has not got enough time to resolve correct data). Thus, for critical applications (such as medical, for example), the warning signal can be used to prompt a controller to reprogram itself or completely shutdown to prevent malfunction, as is well appreciated by those skilled in the art.

Figure 2:
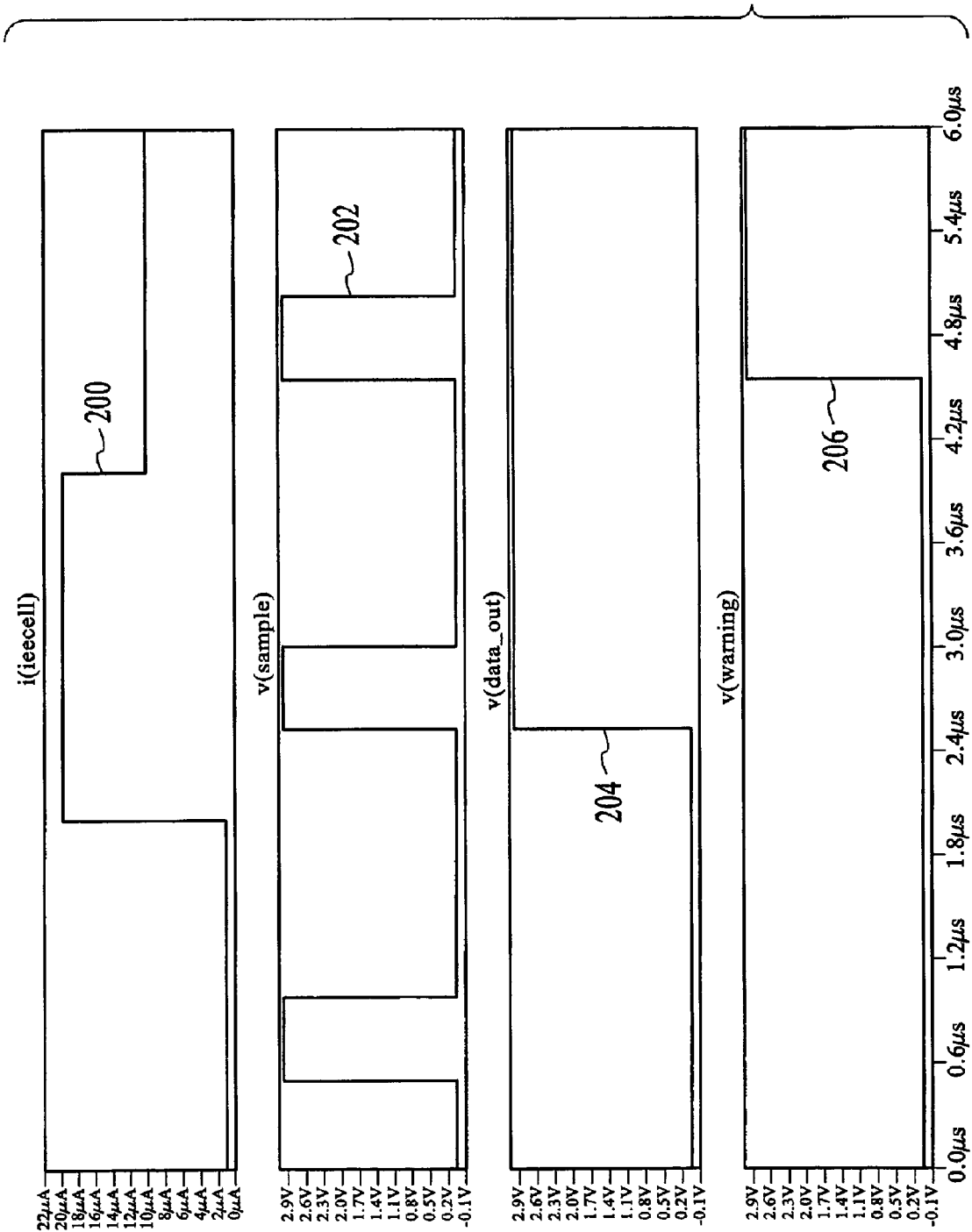
FIG. 2 illustrates an example simulation of operation of the circuit of FIG. 1 in accordance with the present invention.

FIG. 2 illustrates a signal diagram from a simulation of operation of the circuit of FIG. 1. It should be appreciated that this simulation reflects a loss of charge in the cell. Similar simulations give a brown out indication if the supply voltage drops or the clock frequency is too high.

Referring to FIG. 2, signal line 200 represents current levels of a flash cell (i(ieecell)). Signal line 202 represents voltage levels of the sample signal (v(sample)). The data output from latch 114 and buffered through inverter 116 is represented as voltage levels by signal line 204 (v(data_out)). Signal line 206 represents voltage levels of the warning signal (v(warning)) output from combinatorial logic 126. Three program conditions of the flash cell are represented in the signal lines. Namely, an unprogrammed cell condition is present at 0.5 us (microseconds), a good programmed flash cell is present at 2.5 us, and a slightly discharged programmed cell (brown out) condition is present at 4.5 us. As shown, the warning signal goes high in correspondence with the drop in current from the flash cell, indicative of a loss of charge in the cell and thus a drop in the supply voltage.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

I claim:

1. A brown out detection circuit comprising:
   a sense amplifier for sensing a current level exhibited by a flash cell; and
   combinatorial logic coupled to the sense amplifier for identifying a brown out condition of the flash cell when the sensed current level of the flash cell in a programmed state drops below a predetermined threshold in order to provide a warning of a potential malfunction of the flash cell from the brown out condition.

2. The circuit of claim 1 further comprising first and second current comparators coupled to the sense amplifier and receiving the sensed current level.

3. The circuit of claim 2 further comprising a first latch coupled to the first current comparator and a second latch coupled to the second current comparator to latch outputs from the first and second current comparators.

4. The circuit of claim 3 wherein the combinatorial logic further comprises an XOR gate logically combining outputs from the first and second latches.

5. The circuit of claim 4 wherein the XOR gate output provides the warning as an output signal.

6. A method for detecting a brown out condition, the method comprising:
   sensing a current level exhibited by a flash cell; and
   identifying a brown out condition of the flash cell when the sensed current level of the flash cell in a programmed state drops below a predetermined threshold in order to provide a warning of a potential malfunction of the flash cell from the brown out condition.

7. The method of claim 6 further comprising comparing the sensed current level of the flash cell to a predetermined threshold level, by first and second current comparator circuits.

8. The method of claim 7 further comprising latching outputs from the first and second current comparator circuits in first and second latch circuits.

9. The method of claim 8 further comprising logically combining outputs from the first and second latch circuits with an XOR gate.

10. The method of claim 9 further comprising providing the warning as an output signal from the XOR gate.

11. A brown out detection circuit comprising:
    a current source providing a current level exhibited by a flash memory cell;
    a sense amplifier coupled to the current source for sensing the current level;
    current comparator circuitry coupled to the sense amplifier for comparing the sensed current level to a predetermined threshold; and
    combinatorial logic coupled to the current comparator circuitry for identifying a brown out condition when the sensed current level drops below the predetermined threshold in order to provide a warning of a potential malfunction of the flash memory cell from the brown out condition.

12. The circuit of claim 11 wherein the current comparator circuitry further comprising first and second current comparators.

13. The circuit of claim 12 further comprising a first latch coupled to the first current comparator and a second latch coupled to the second current comparator to latch outputs from the first and second current comparators.

14. The circuit of claim 13 wherein the combinatorial logic further comprises an XOR gate logically combining outputs from the first and second latches.

15. The circuit of claim 14 wherein the XOR gate output provides the warning as an output signal.

16. A system comprising:
    a microcontroller;
    a flash memory cell coupled to the microcontroller; and
    a brown out detection circuit coupled to the flash memory cell; the brown out detection circuit comprising a sense amplifier for sensing a current level exhibited by the flash memory cell; and
    combinatorial logic coupled to the sense amplifier to identify a brown out condition of the flash memory cell when the sensed current level of the flash memory cell in a programmed state drops below a predetermined threshold in order to provide a warning of a potential malfunction of the flash memory cell from the brown out condition.

17. A circuit, comprising:
    a sense amplifier for sensing a current level drawn by a programmed flash cell;
    a logic circuit coupled to the sense amplifier to compare the sensed current level to a predetermined threshold level to provide a warning signal of a potential malfunction of the programmed flash cell from a brown out condition if the current drops below about 80% of a maximum value.

18. The circuit of claim 17, wherein the warning signal prompts a controller to reprogram itself.

19. The circuit of claim 17, wherein the warning signal prompts a signal to shut down to prevent malfunction.

* * * * *

UNITED STATES PATENT AND TRADEMARK OFFICE
CERTIFICATE OF CORRECTION

| | |
|---|---|
| PATENT NO. | : 7,693,669 B2 |
| APPLICATION NO. | : 11/104960 |
| DATED | : April 6, 2010 |
| INVENTOR(S) | : Terje Saether |

It is certified that error appears in the above-identified patent and that said Letters Patent is hereby corrected as shown below:

In Sheet 1 of 2, below Reference Numeral T5, in Figure 1, line 2, delete " ∽ " and insert -- 112 --, therefor.

In column 3, line 47, in Claim 4, delete "and" and insert -- and the --, therefor.

Signed and Sealed this
Twenty-seventh Day of December, 2011

David J. Kappos
*Director of the United States Patent and Trademark Office*